(12) United States Patent
Yu et al.

(10) Patent No.: US 12,159,851 B2
(45) Date of Patent: Dec. 3, 2024

(54) PACKAGE STRUCTURE HAVING HOLLOW CYLINDERS AND METHOD OF FABRICATING THE SAME

(71) Applicant: Taiwan Semiconductor Manufacturing Company, Ltd., Hsinchu (TW)

(72) Inventors: Chen-Hua Yu, Hsinchu (TW); Chung-Shi Liu, Hsinchu (TW); Hao-Yi Tsai, Hsinchu (TW); Tin-Hao Kuo, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 101 days.

(21) Appl. No.: 17/726,533

(22) Filed: Apr. 22, 2022

(65) Prior Publication Data
US 2022/0246570 A1 Aug. 4, 2022

Related U.S. Application Data

(63) Continuation of application No. 16/231,619, filed on Dec. 24, 2018, now Pat. No. 11,342,295.

(51) Int. Cl.
| | |
|---|---|
| *H01L 29/80* | (2006.01) |
| *H01L 21/56* | (2006.01) |
| *H01L 23/00* | (2006.01) |
| *H01L 23/31* | (2006.01) |

(Continued)

(52) U.S. Cl.
CPC ............ *H01L 24/20* (2013.01); *H01L 21/565* (2013.01); *H01L 21/568* (2013.01); *H01L 23/3128* (2013.01); *H01L 23/4006* (2013.01); *H01L 23/49816* (2013.01); *H01L 23/49822* (2013.01); *H01L 23/49838* (2013.01); *H01L 24/19* (2013.01); *H01L 2023/4031* (2013.01);
(Continued)

(58) Field of Classification Search
CPC ..... H01L 24/20; H01L 21/565; H01L 21/568; H01L 23/3128; H01L 23/4006; H01L 23/49816; H01L 23/49822; H01L 23/49838; H01L 24/19; H01L 2023/4031; H01L 2023/405; H01L 2023/4087; H01L 2224/211
USPC ......................................................... 257/269
See application file for complete search history.

(56) References Cited

U.S. PATENT DOCUMENTS

| | | | | |
|---|---|---|---|---|
| 5,648,890 A | * | 7/1997 | Loo ................... | H01L 25/0655 257/726 |
| 8,455,987 B1 | * | 6/2013 | Spann ................. | H01L 24/97 257/E23.141 |
| 9,000,584 B2 | | 4/2015 | Lin et al. | |

(Continued)

*Primary Examiner* — Caleb E Henry
*Assistant Examiner* — Dilinh P Nguyen
(74) *Attorney, Agent, or Firm* — JCIPRNET

(57) ABSTRACT

A package structure includes at least one semiconductor die, a plurality of hollow cylinders, an insulating encapsulant, a redistribution layer and through holes. The plurality of hollow cylinders is surrounding the at least one semiconductor die. The insulating encapsulant has a top surface and a bottom surface opposite to the top surface, wherein the insulating encapsulant encapsulates the at least one semiconductor die and the plurality of hollow cylinders. The redistribution layer is disposed on the top surface of the insulant encapsulant and over the at least one semiconductor die. The through holes are penetrating through the plurality of hollow cylinders.

16 Claims, 16 Drawing Sheets

(51) Int. Cl.
*H01L 23/40* (2006.01)
*H01L 23/498* (2006.01)

(52) U.S. Cl.
CPC .............................. *H01L 2023/405* (2013.01); *H01L 2023/4087* (2013.01); *H01L 2224/211* (2013.01)

(56) References Cited

U.S. PATENT DOCUMENTS

| | | |
|---|---|---|
| 9,048,222 B2 | 6/2015 | Hung et al. |
| 9,048,233 B2 | 6/2015 | Wu et al. |
| 9,064,874 B2 | 6/2015 | Edelstein et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,342,295 B2 * | 5/2022 | Yu ..................... H01L 23/49816 |
| 2017/0309580 A1 * | 10/2017 | Pola .................. H01L 23/49503 |
| 2019/0287820 A1 * | 9/2019 | Huang .............. H01L 21/76843 |

* cited by examiner

PACKAGE STRUCTURE HAVING HOLLOW CYLINDERS AND METHOD OF FABRICATING THE SAME

CROSS-REFERENCE TO RELATED APPLICATION

This application is a continuation application of U.S. application Ser. No. 16/231,619, filed on Dec. 24, 2018, now allowed. The entirety of the above-mentioned patent application is hereby incorporated by reference herein and made a part of this specification.

BACKGROUND

Semiconductor devices and integrated circuits used in a variety of electronic applications, such as cell phones and other electronic equipment, are typically manufactured on a single semiconductor wafer. The dies of the wafer may be processed and packaged with other semiconductor devices or dies at the wafer level, and various technologies have been developed for the wafer level packaging.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
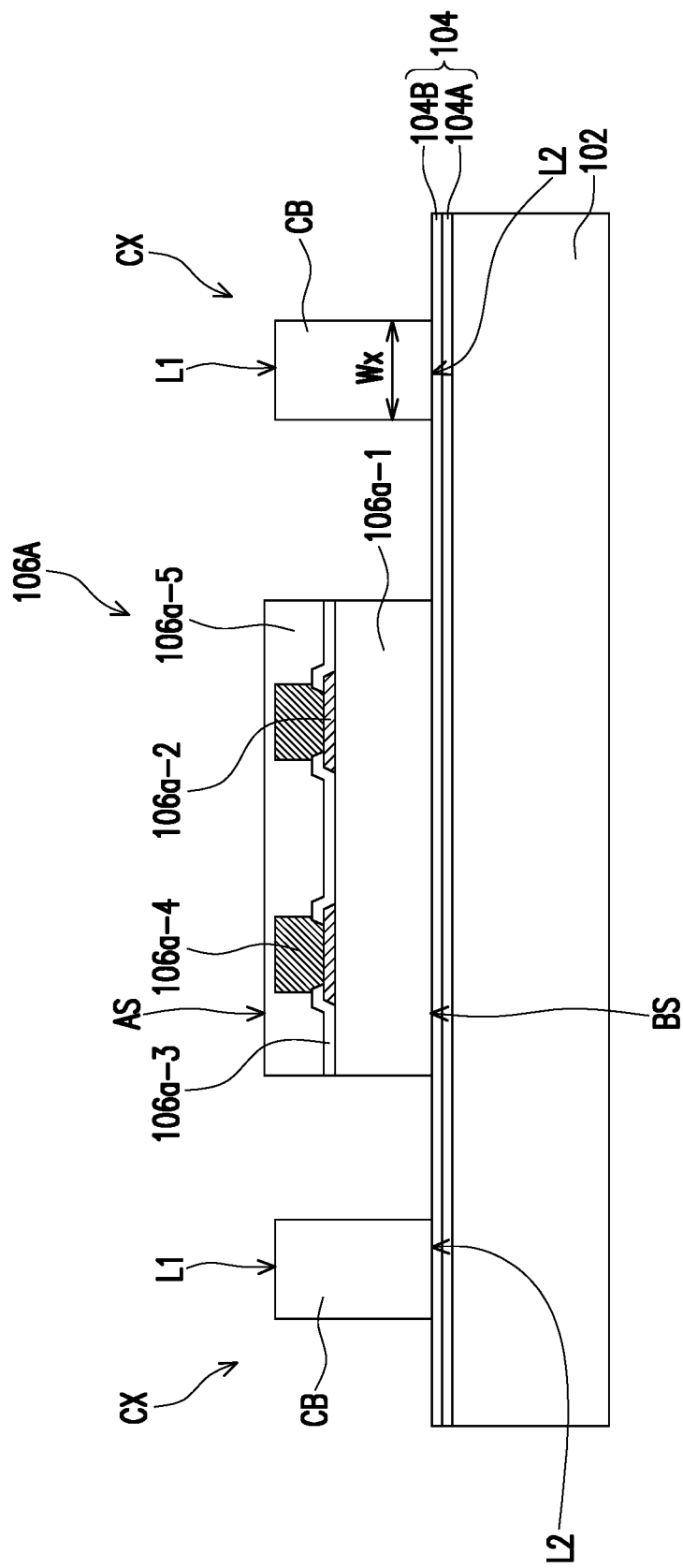
FIG. 1A to FIG. 7 are schematic cross-sectional views of various stages in a manufacturing method of a package structure according to some exemplary embodiments of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 7 are schematic cross-sectional views of various stages in a manufacturing method of a package structure according to some exemplary embodiments of the present disclosure. Referring to FIG. 1A, a carrier 102 with a buffer layer 104 coated thereon is provided. In one embodiment, the carrier 102 may be a glass carrier or any suitable carrier for carrying a semiconductor wafer or a reconstituted wafer used for the method of fabricating the package structure.

In some embodiments, the buffer layer 104 includes a de-bonding layer 104A and a dielectric layer 104B, wherein the de-bonding layer 104A is located in between the carrier 102 and the dielectric layer 104B. In certain embodiments, the de-bonding layer 104A is disposed on the carrier 102, and the material of the de-bonding layer 104A may be any material suitable for bonding and de-bonding the carrier 102 from the above layer(s) (e.g., the dielectric layer 104B) or any wafer(s) disposed thereon. In some embodiments, the de-bonding layer 104A may include a release layer (such as a light-to-heat conversion ("LTHC") layer) or an adhesive layer (such as an ultra-violet curable adhesive or a heat curable adhesive layer). In some embodiments, the dielectric layer 104B may be formed above the de-bonding layer 104A. The dielectric layer 104B may be made of dielectric materials such as benzocyclobutene ("BCB"), polybenzoxazole ("PBO"), or any other suitable polymer-based dielectric material.

It is noted that the materials of the carrier 102, the de-bonding layer 104A and the dielectric layer 104B are not limited to the descriptions of the embodiments. In some alternative embodiments, the dielectric layer 104B may be optionally omitted; in other words, merely the de-bonding layer 104A is formed over the carrier 102. In certain embodiments, a die-attach film (not shown) may be directly formed on the de-bonding layer 104A for the attachment to above components.

Figure 1B:
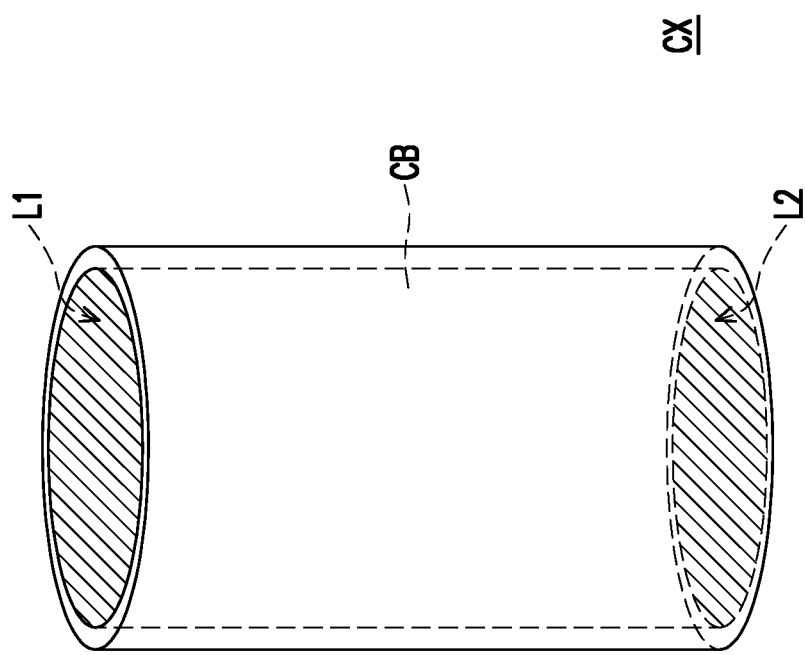

After forming the buffer layer 104, a plurality of hollow cylinders CX and at least one semiconductor die 106A are disposed on the carrier 102 over the buffer layer 104. FIG. 1B is an enlarged view of the hollow cylinder CX. Referring to FIG. 1B, in the exemplary embodiment, each of the hollow cylinders CX includes a cylindrical body CB, the hollow cylinders CX have lids (L1/L2) covering two opposite terminals of the cylindrical body CB. For instance, a first lid L1 is sealing a first terminal of the cylindrical body CB, and a second lid L2 is sealing a second terminal of the cylindrical body CB, wherein the first terminal is opposite to the second terminal. In certain embodiments, the cylindrical body CB is hollow in the middle. In other words, a space exists in between the first lid L1 and the second lid L2.

Referring back to FIG. 1A, in some embodiments, a width Wx of the hollow cylinders CX is in a range of 1 mm to 10 mm, but the disclosure is not limited thereto. In alternative embodiments, the width Wx of the hollow cylinders CX may be adjusted based on actual design requirements. In some embodiments, the hollow cylinders CX are disposed to surround the semiconductor die 106A. In case where a plurality of semiconductor dies exist, the hollow cylinders CX are disposed to surround all the plurality of semiconductor dies. In some embodiments, the hollow cylinders CX are located at corners or edges of the package structure. In some embodiments, the hollow cylinders CX may be disposed on the carrier 102 after bonding the semiconductor die 106A on the carrier 102. In some alternative embodiments, the hollow cylinders CX may be disposed on the carrier 102 before bonding the semiconductor die 106A on the carrier 102. In some embodiments, the hollow cylinders CX are made of a plastic material or a metal material. In certain embodiments, the hollow cylinders CX are made of metal materials such as copper, gold, silver, or made of plastic materials such as poly(methyl methacrylate), the disclosure is not limited thereto.

As illustrated in FIG. 1A, one or more semiconductor die 106A may be picked and placed on the buffer layer 104. In certain embodiments, the semiconductor die 106A has an active surface AS, and a backside surface BS opposite to the active surface AS. For example, the backside surface BS of the semiconductor die 106A may be attached to the buffer layer 104 through a die attach film (not shown). By using the die attach film, a better adhesion between the semiconductor die 106A and the buffer layer 104 is ensured. In the exemplary embodiment, only one semiconductor die 106 is illustrated. However, the disclosure is not limited thereto. It should be noted that the number of semiconductor die 106A disposed on the buffer layer 104 may be adjusted based on product requirement.

In the exemplary embodiment, the semiconductor die 106A includes a semiconductor substrate 106a-1, a plurality of conductive pads 106a-2, a passivation layer 106a-3, a plurality of conductive posts 106a-4, and a protection layer 106a-5. As illustrated in FIG. 1A, the plurality of conductive pads 106a-2 is disposed on the semiconductor substrate 106a-1. The passivation layer 106a-3 is formed over the semiconductor substrate 106a-1 and has openings that partially expose the conductive pads 106a-2 on the semiconductor substrate 106a-1. The semiconductor substrate 106a-1 may be a bulk silicon substrate or a silicon-on-insulator (SOI) substrate, and further includes active components (e.g., transistors or the like) and optionally passive components (e.g., resistors, capacitors, inductors or the like) formed therein. The conductive pads 106a-2 may be aluminum pads, copper pads or other suitable metal pads. The passivation layer 106a-3 may be a silicon oxide layer, a silicon nitride layer, a silicon oxy-nitride layer or a dielectric layer formed of any suitable dielectric materials. Furthermore, in some embodiments, a post-passivation layer (not shown) is optionally formed over the passivation layer 106a-3. The post-passivation layer covers the passivation layer 106a-3 and has a plurality of contact openings. The conductive pads 106a-2 are partially exposed by the contact openings of the post passivation layer. The post-passivation layer may be a benzocyclobutene (BCB) layer, a polyimide layer, a polybenzoxazole (PBO) layer, or a dielectric layer formed by other suitable polymers. In some embodiments, the conductive posts 106a-4 are formed on the conductive pads 106a-2 by plating. In some embodiments, the protection layer 106a-5 is formed on the passivation layer 106a-3 or on the post passivation layer, and covering the conductive posts 106a-4 so as to protect the conductive posts 106a-4. In some embodiments, the semiconductor die 106A may be selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto.

Figure 2:
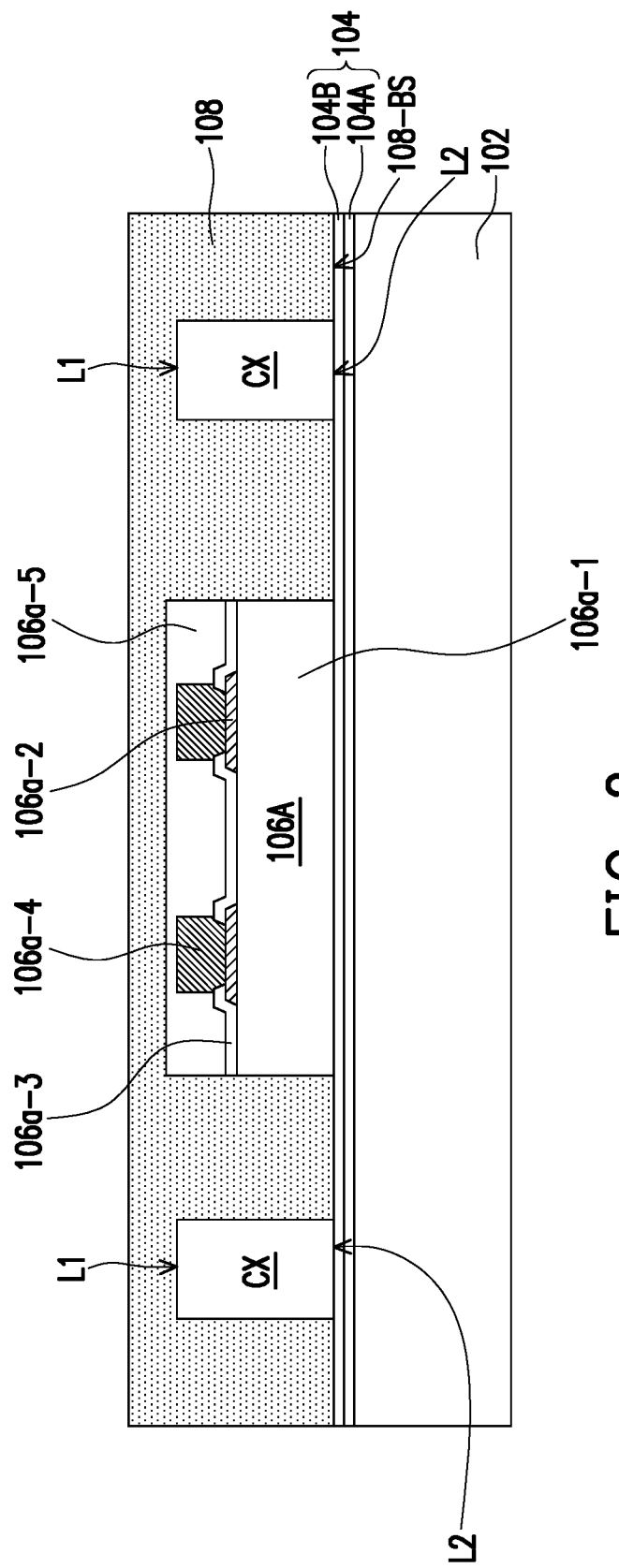

Referring to FIG. 2, in a next step, an insulating material 108 is formed on the buffer layer 104 and over the semiconductor die 106A. The insulating material 108 is formed to cover the hollow cylinders CX. In the exemplary embodiment, since the terminals of the hollow cylinders CX are covered by the lids (L1/L2), the insulating material 108 does not fill into the space within the hollow cylinders CX. In some embodiments, the insulating material 108 is formed through, for example, a compression molding process, filling up the gaps between the semiconductor die 106A and the hollow cylinders CX, and encapsulating the semiconductor die 106A. The insulating material 108 also covers and encapsulates the hollow cylinders CX. At this stage, the conductive posts 106a-4 and the protection layer 106a-5 are encapsulated by and well protected by the insulating material 108. In other words, the conductive posts 106a-4 and the protection layer 106a-5 are not revealed by the insulating material 108.

In some embodiments, the insulating material 108 includes polymers (such as epoxy resins, phenolic resins, silicon-containing resins, or other suitable resins), dielectric materials having low permittivity (Dk) and low loss tangent (DO properties, or other suitable materials. In an alternative embodiment, the insulating material 108 may include an acceptable insulating encapsulation material. In some embodiments, the insulating material 108 may further include inorganic filler or inorganic compound (e.g. silica, clay, and so on) which can be added therein to optimize coefficient of thermal expansion (CTE) of the insulating material 108. The disclosure is not limited thereto.

Figure 3:
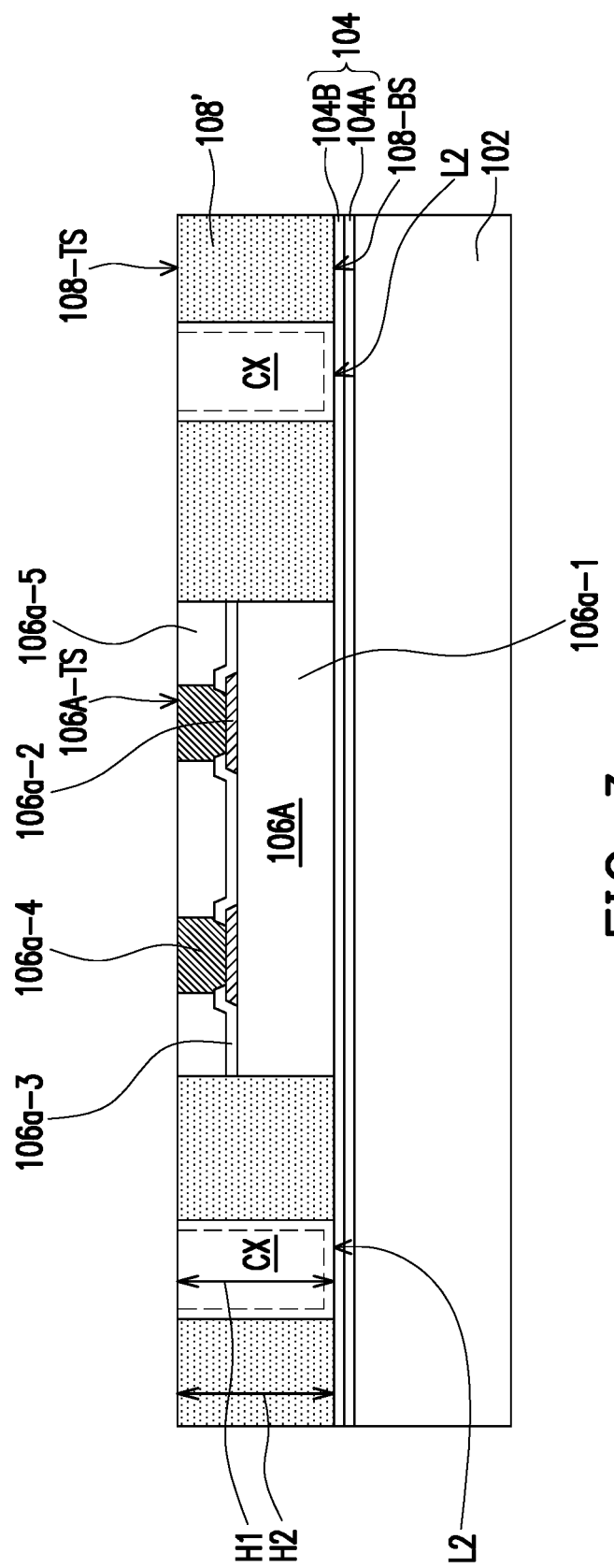

Referring to FIG. 3, a thinning process is performed to remove portions of the insulating material 108 so that the conductive posts 106a-4 and the hollow cylinders CX are revealed. In some embodiments, the insulating material 108 and the protection layer 106a-5 are ground or polished by a planarization step. For example, the planarization step is performed through a mechanical grinding process and/or a chemical mechanical polishing (CMP) process until the top surfaces 106A-TS of the conductive posts 106a-4 are revealed. In some embodiments, the hollow cylinders CX are also partially polished so that the first lids L1 are removed from the terminals of the hollow cylinders CX. In other words, the hollow cylinders CX are grinded and polished to reveal the space therein.

In the illustrated embodiment, the insulating material 108 is polished to form an insulating encapsulant 108'. In some embodiments, the top surface 108T of the insulating encapsulant 108, the top surface of the conductive posts 106a-4, and the top surface of the polished protection layer 106a-5 are coplanar and levelled with one another. In certain embodiments, a height H1 of the hollow cylinders CX is substantially equal to a height H2 of the insulating encapsulant 108' after the grinding/polishing process. In some embodiments, after the mechanical grinding or chemical mechanical polishing (CMP) steps, a cleaning step may be optionally performed. For example, the cleaning step is preformed to clean and remove the residue generated from the planarization step. However, the disclosure is not limited thereto, and the planarization step may be performed through any other suitable methods.

Figure 4:
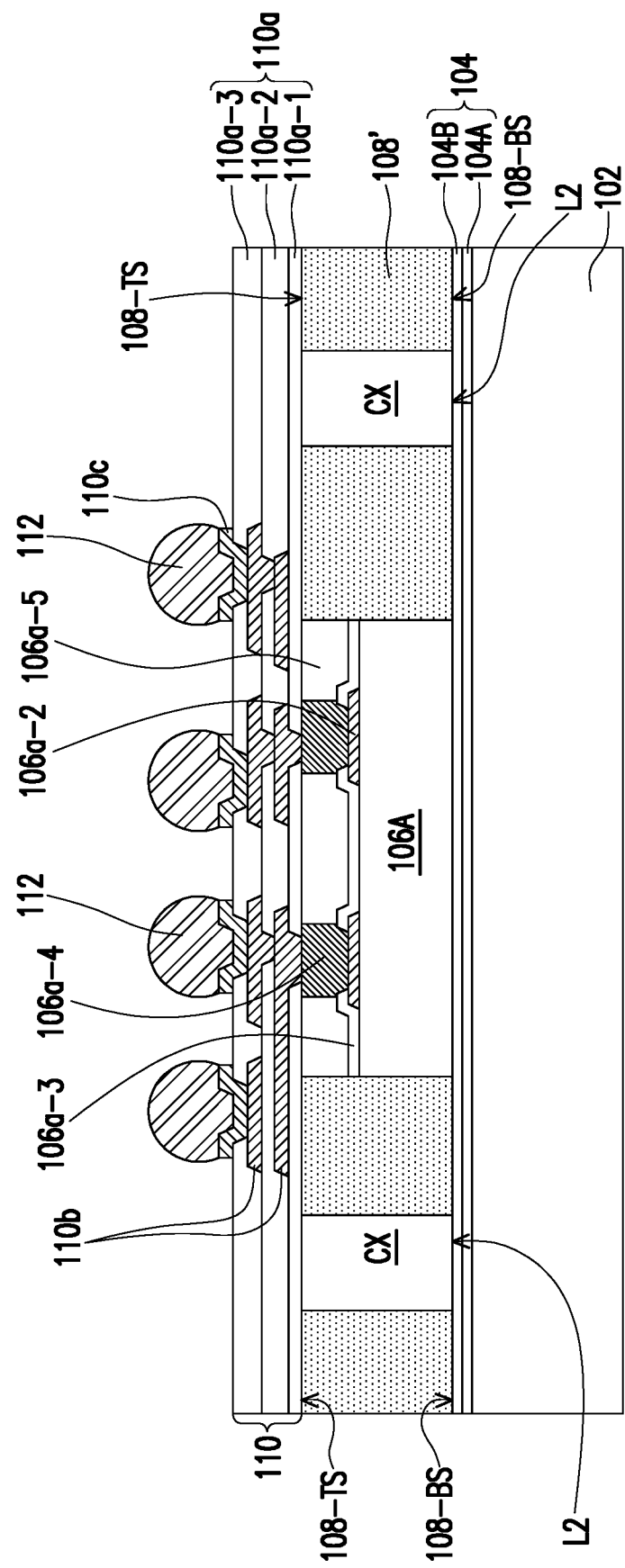

Referring to FIG. 4, after the planarization step, a redistribution layer 110 is formed on the insulating encapsulant 108' and over the semiconductor die 106A and the hollow cylinders CX. In some embodiments, the formation of the redistribution layer 110 includes sequentially forming one or more dielectric layers 110a, and one or more metallization layers 110b in alternation. In certain embodiments, the metallization layers 110b are sandwiched between the dielectric layers 110a. Although only two layers of the metallization layers 110b and three layers of dielectric layers 110a are illustrated herein, however, the scope of the disclose is not limited by the embodiments of the disclosure. In other embodiments, the number of metallization layers 110b and the dielectric layers 110a may be adjusted based on product requirement. In some embodiments, the metallization layers 110b are electrically connected to the conductive posts 106a-4 of the semiconductor die 106A. In certain embodiments, the metallization layers 110b are not located in a region above the hollow cylinders CX.

In certain embodiments, the material of the dielectric layers 114A may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In the exemplary embodiment, a first dielectric layer 110a-1, a second dielectric layer 110a-2 and a third dielectric layer 110a-3 are formed. In some embodiments, in order to prevent the dielectric layer 110a from filling into the space of the hollow cylinders CX, the first dielectric layer 110a-1 is formed over the insulating encapsulant 108' through a lamination step. Subsequently, the second dielectric layer 110a-2 and the third dielectric layer 110a-3 are formed by suitable fabrication techniques such as spin-on coating, chemical vapor deposition (CVD), plasma-enhanced chemical vapor deposition (PECVD) or the like. The disclosure is not limited thereto.

In some embodiments, the material of the metallization layer 110b may be made of conductive materials formed by electroplating or deposition, such as aluminum, titanium, copper, nickel, tungsten, and/or alloys thereof, which may be patterned using a photolithography and etching process. In some embodiments, the metallization layer 110b may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

After forming the redistribution layer 110, a plurality of conductive pads 110c may be disposed on an exposed top surface of the topmost layer of the metallization layers 110b for electrically connecting with conductive balls. In certain embodiments, the conductive pads 110c are for example, under-ball metallurgy (UBM) patterns used for ball mount. As shown in FIG. 4, the conductive pads 110c are formed on and electrically connected to the redistribution layer 110. In some embodiments, the materials of the conductive pads 110c may include copper, nickel, titanium, tungsten, or alloys thereof or the like, and may be formed by an electroplating process, for example. The number of conductive pads 110c are not limited in this disclosure, and may be selected based on the design layout. In some alternative embodiments, the conductive pads 110c may be omitted. In other words, conductive balls 112 formed in subsequent steps may be directly disposed on the redistribution layer 110.

Referring still to FIG. 4, after forming the conductive pads 110c, a plurality of conductive balls 112 is disposed on the conductive pads 110c and over the redistribution layer 110. In some embodiments, the conductive balls 112 may be disposed on the conductive pads 110c by a ball placement process or reflow process. In some embodiments, the conductive balls 112 are, for example, solder balls or ball grid array (BGA) balls. In some embodiments, the conductive balls 112 are connected to the redistribution layer 110 through the conductive pads 110c. In certain embodiments, the conductive balls 112 may be electrically connected to the semiconductor die 106A through the redistribution layer 110. The number of the conductive balls 112 is not limited to the disclosure, and may be designated and selected based on the number of the conductive pads 110c. In some alternative embodiments, an integrated passive device (IPD) (not shown) may optionally be disposed on the redistribution layer 110 and be electrically connected to the redistribution layer 110.

Figure 5:
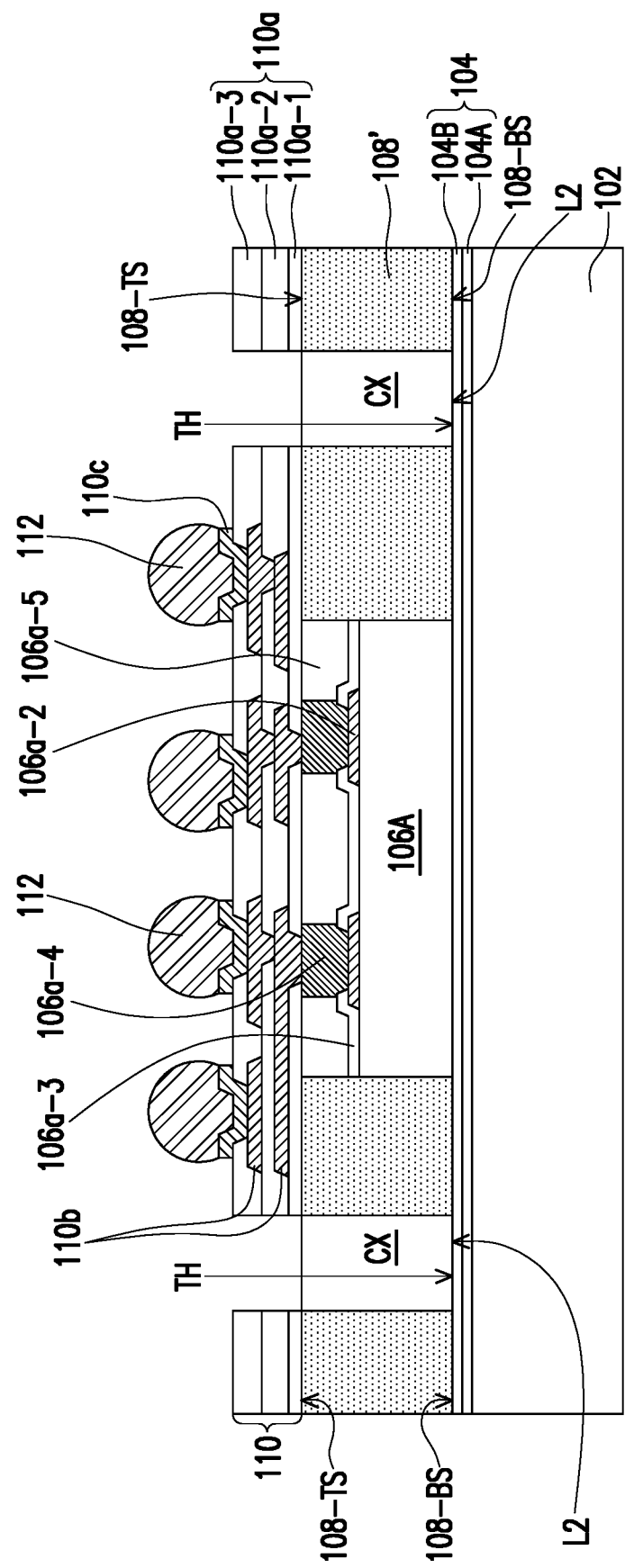

Referring to FIG. 5, in a next step, portions of the redistribution layer 110 are removed to form the through holes TH. For example, the redistribution layer 110 may be removed through mechanical or laser drilling. In certain embodiments, portions of the redistribution layer 110 located above the hollow cylinders CX are removed to reveal the space in the hollow cylinders CX and to form the through holes TH. In some embodiments, the through holes TH penetrate through the redistribution layer 110 and is connected to the space within the hollow cylinders CX.

Figure 6:
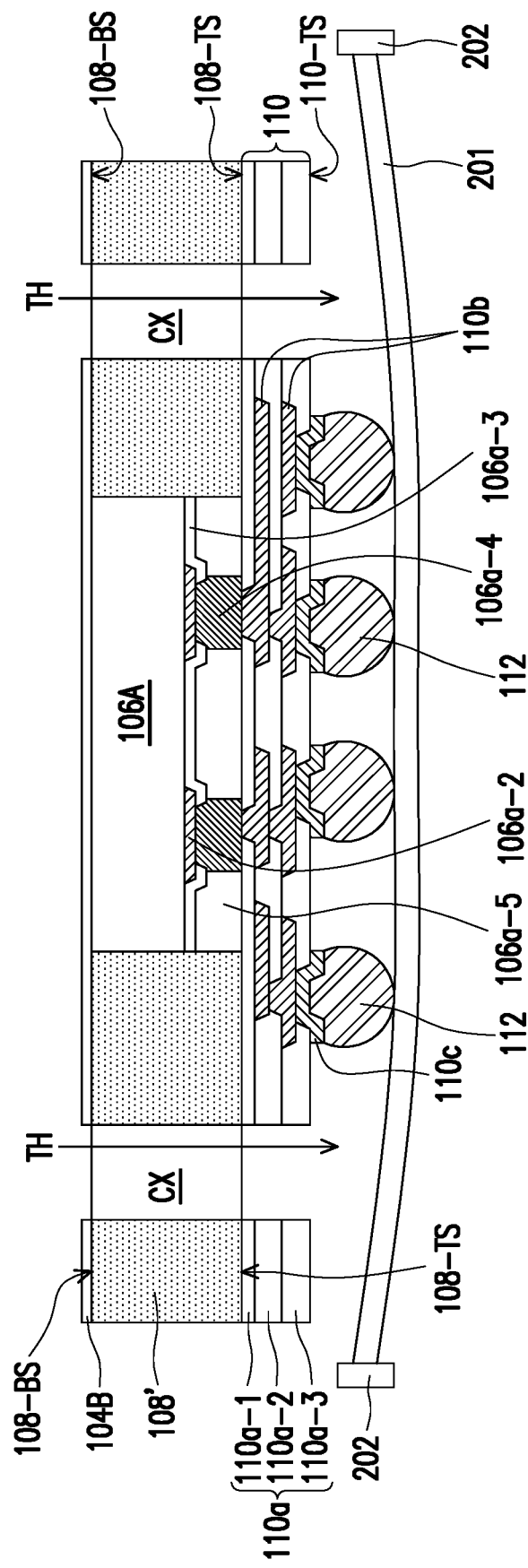

Referring to FIG. 6, after removing portions of the redistribution layer 110, the structure shown in FIG. 5 may be turned upside down and attached to a tape 201 supported by a frame 202. Subsequently, the carrier 102 is de-bonded so as to separate the dielectric layer 104B and the other elements formed thereon from the carrier 102. In the exemplary embodiment, the de-bonding process includes projecting a light such as a laser light or an UV light on the de-bonding layer 104A (e.g., the LTHC release layer), such that the carrier 102 can be easily removed. In certain embodiments, the de-bonding layer 104A may be further removed or peeled off to reveal the dielectric layer 104B. The remaining dielectric layer 104B may then be patterned to form a plurality of openings that reveal the second lids L2 of the hollow cylinders, wherein the second lids L2 are further removed to complete the formation of the through holes TH. In some embodiments, the through holes TH penetrate through the hollow cylinders CX and the redistribution layer 110. In certain embodiments, the through holes TH extends from the bottom surface 108-BS of the insulating encapsulant 108' through the plurality of hollow cylinders CX to a top surface 110-TS of the redistribution layer 110.

Figure 7:
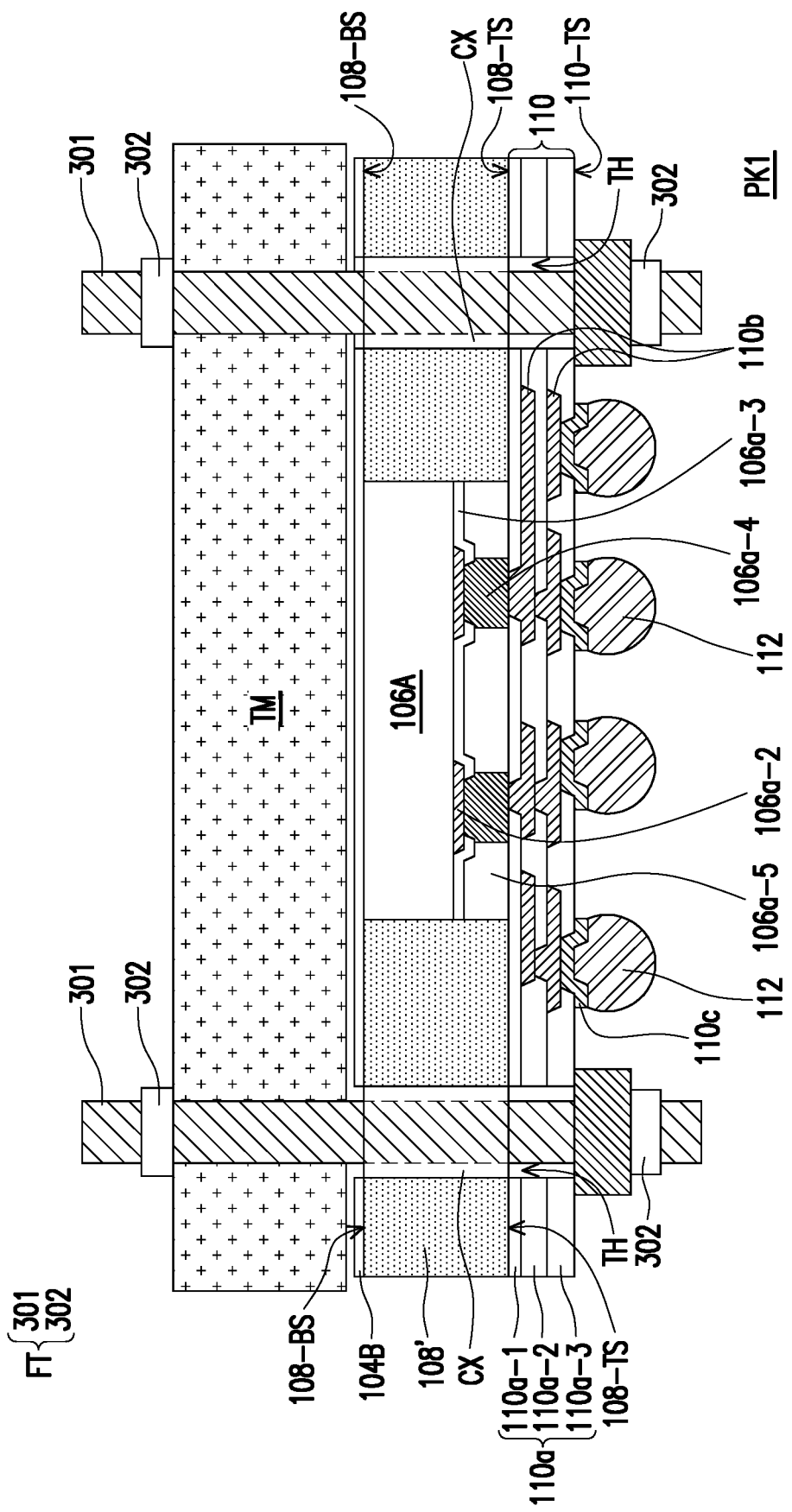

Referring to FIG. 7, after forming the through holes TH, a thermal module TM may be disposed on the bottom surface 108-BS of the insulating encapsulant 108'. In some embodiments, the thermal module TM may be a heat sink, a cold plate, or the like, the disclosure is not limited thereto. In certain embodiments, the thermal module TM may be any type of thermal modules used for improving thermal dissipation. After providing the thermal module TM, a fastener FT is used for mechanically fixing the thermal module TM to the package structure PK1. In some embodiments, the fastener FT includes a bolt 301 that passes through the through holes TH, and nuts 302 located over the thermal module TM and the redistribution layer 110, wherein the nuts 302 are threaded onto the bolt 301. In the exemplary embodiment, bolt 301 and nuts 302 are used as the fastener FT for mechanically fixing the thermal module TM to the package structure PK1, however, the disclosure is not limited thereto. In alternative embodiments, any other type of fasteners that is suitable for mechanically fixing the thermal module TM to the package structure PK1 can be used.

Figure 8:
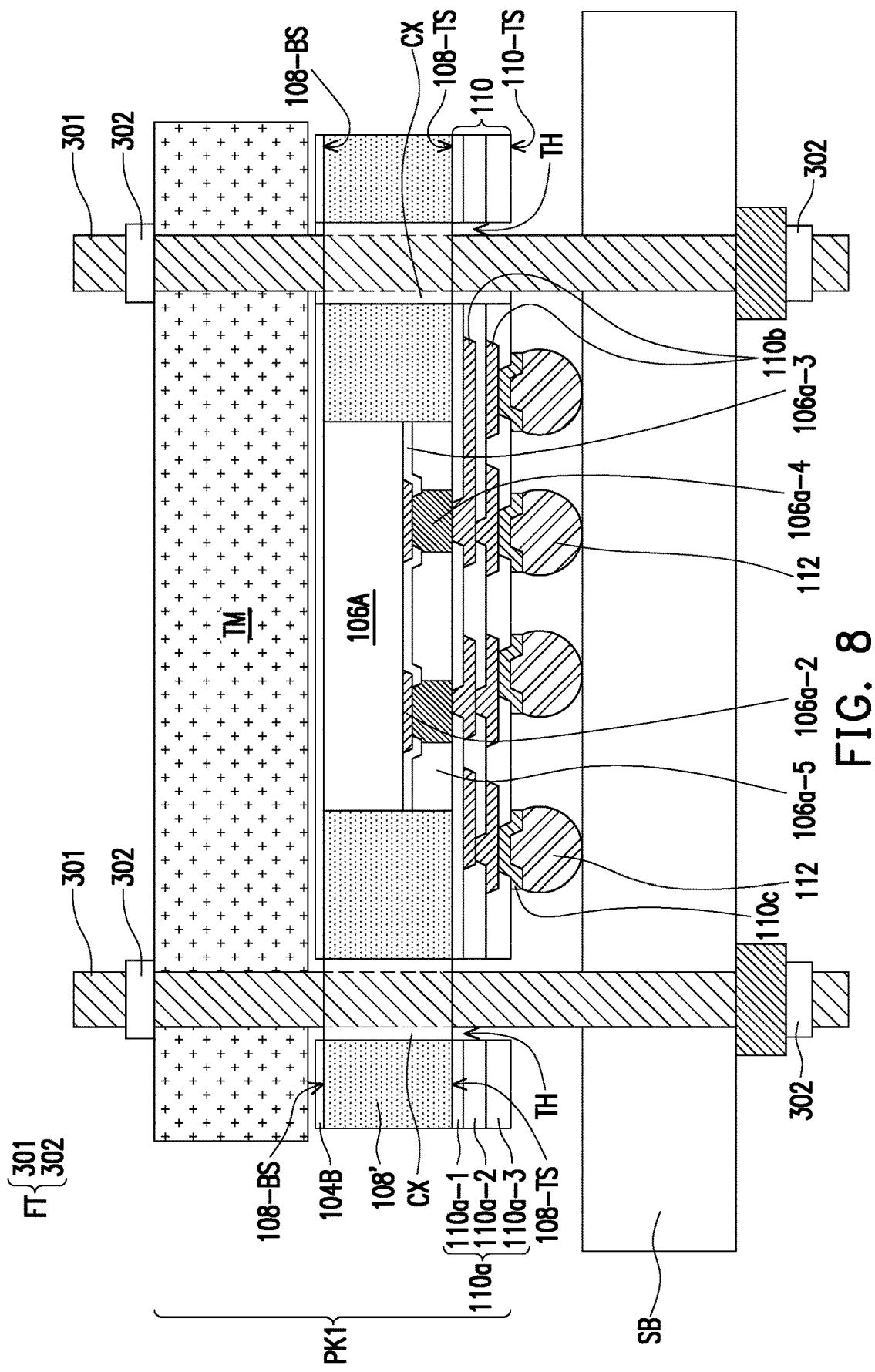
FIG. 8 is a cross-sectional of an electronic assembly according to some exemplary embodiments of the present disclosure.

FIG. 8 is a cross-sectional of an electronic assembly according to some exemplary embodiments of the present disclosure. Referring to FIG. 8, in some embodiments, the package structure PK1 obtained in FIG. 7 may be further mounted onto a circuit substrate SB with other packages, passive devices, and connectors (not shown) to form an electronic assembly. In certain embodiments, the package structure PK1 is electrically connected to the circuit substrate SB through the conductive balls 112. After mounting the package structure PK1 onto the circuit substrate SB, the fastener FT is used for mechanically fixing the package structure PK1 to the circuit substrate. For example, the fastener FT includes a bolt 301 that passes through the through holes TH, and nuts 302 located over the thermal module TM and the circuit substrate SB, wherein the nuts 302 are threaded onto the bolt 301.

FIG. 9 to FIG. 14 are schematic cross-sectional views of various stages in a manufacturing method of a package structure according to some other exemplary embodiments of the present disclosure. The embodiment shown in FIG. 9 to FIG. 14 is similar to the embodiment shown in FIG. 1A to FIG. 7, hence the same reference numerals are used to refer to the same or liked parts. The difference between the embodiments will be described below.

Figure 9:
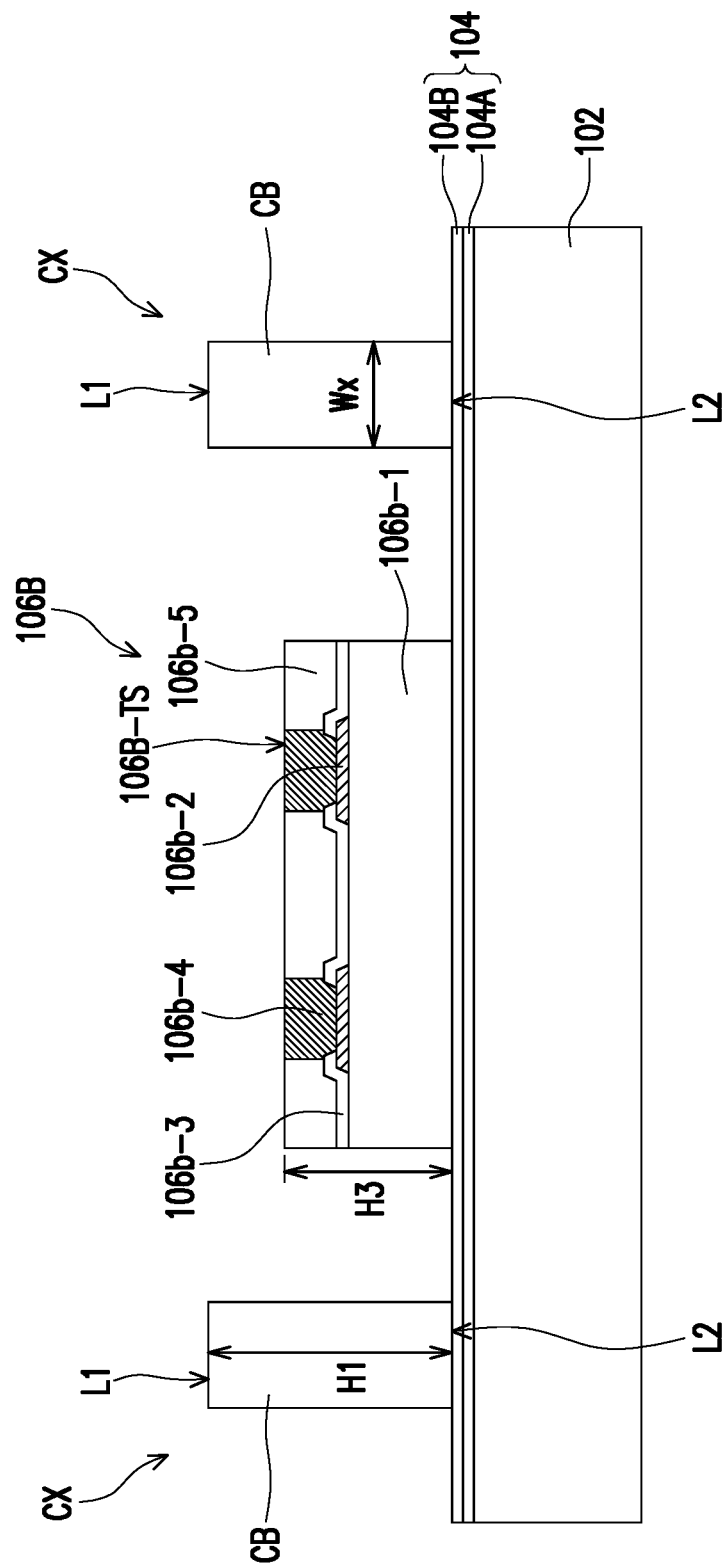
FIG. 9 to FIG. 14 are schematic cross-sectional views of various stages in a manufacturing method of a package structure according to some other exemplary embodiments of the present disclosure.

Referring to FIG. 9, a plurality of hollow cylinders CX and at least one semiconductor die 106B are disposed on the carrier 102 over the buffer layer 104. The hollow cylinders CX are disposed on the carrier 102 to surround the semiconductor die 106B. In the exemplary embodiment, a height H1 of the hollow cylinders CX is greater than a height H3 of the semiconductor die 106B. The semiconductor die 106B includes a semiconductor substrate 106b-1, a plurality of conductive pads 106b-2, a passivation layer 106b-3, a plurality of conductive posts 106b-4, and a protection layer 106b-5. As illustrated in FIG. 1A, a top surface 106B-TS of the conductive posts 106b-4 are exposed from the protection layer 106b-5.

Figure 10:
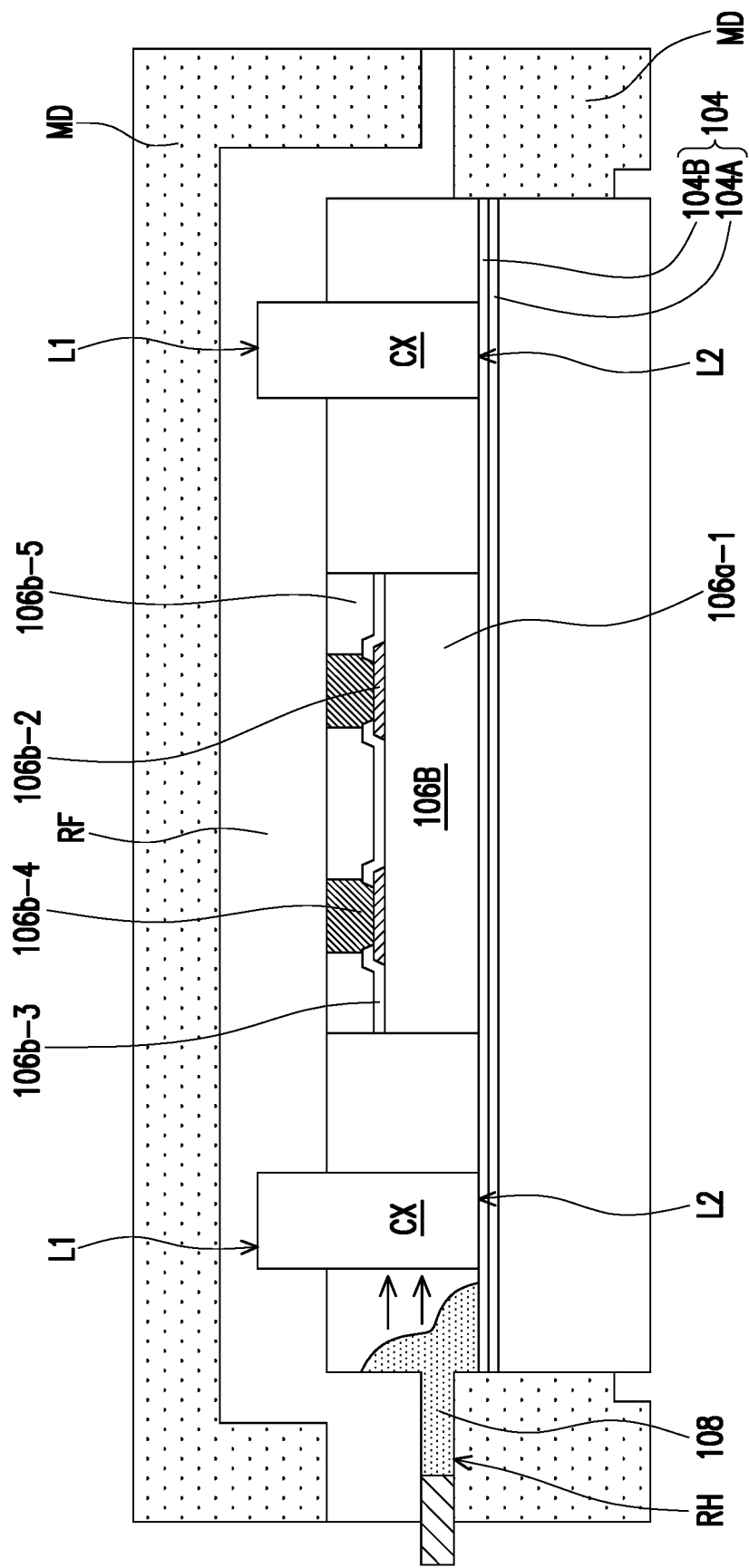

Referring to FIG. 10, in a next step, a mold MD is provided on the carrier 102 covering the semiconductor die 106B and the plurality of hollow cylinders CX. In some embodiments, the mold MD may comprise runner holes RH and a release film RF attached to an inner surface of the mold MD. The runner holes RH are located on one side of the mold MD. In some embodiments, the release film RF is pressed onto the semiconductor die 106B to cover the top surface 106B-TS of the conductive posts 106b-4. Furthermore, the release film RF is further pressed onto the hollow cylinders CX to partially cover the hollow cylinders CX. Thereafter, an insulating material 108 is injected into the mold MD through the runner holes RH, so that the insulating material 108 encapsulates the semiconductor die 106B and partially encapsulates the plurality of hollow cylinders CX. In some embodiments, the insulating material 108 is injected from one side of the mold MD and is spread onto the buffer layer 104 to cover the buffer layer 104. In some embodiments, the insulating material 108 spreads and surrounds the semiconductor die 106B. In certain embodiments, the insulating material 108 fill up the gaps in between the semiconductor die 106B and adjacent hollow cylinders CX. Due to the presence of the release film RF, portions of hollow cylinders CX are not covered by the insulating material 108.

Figure 11:
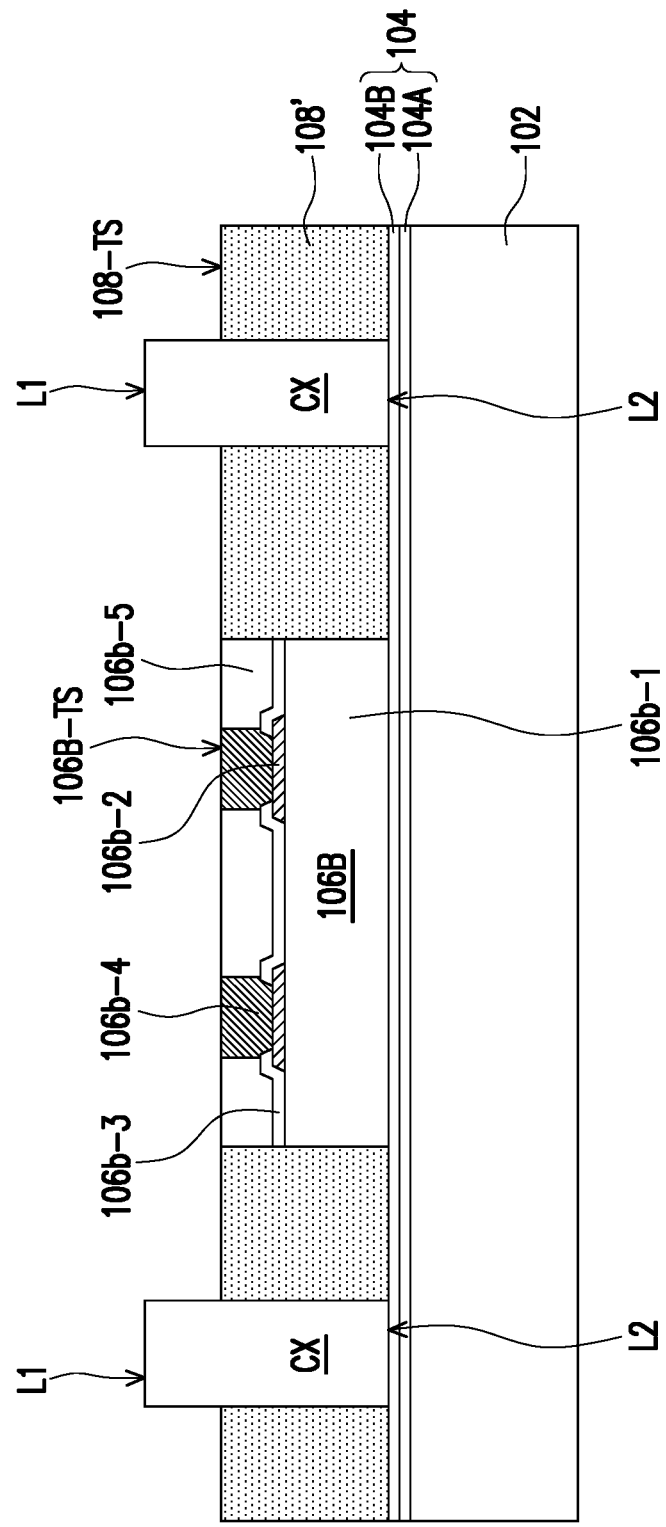

Referring to FIG. 11, in a next step, the insulating material 108 is cured to form an insulating encapsulant 108'. The mold MD may then be removed, and the release film RF is peeled off to reveal a top surface 106B-TS of the conductive posts 106b-4 and portions of the hollow cylinders CX. After removing the mold MD, the formed insulating encapsulant 108' encapsulates the semiconductor die 106B and partially encapsulates the plurality of hollow cylinders CX. In certain embodiments, the plurality of hollow cylinders CX protrude out from the insulating encapsulant 108'. At this stage, the terminals of each of the hollow cylinders CX are still sealed by the first lids L1 and the second lids L2.

Figure 12:
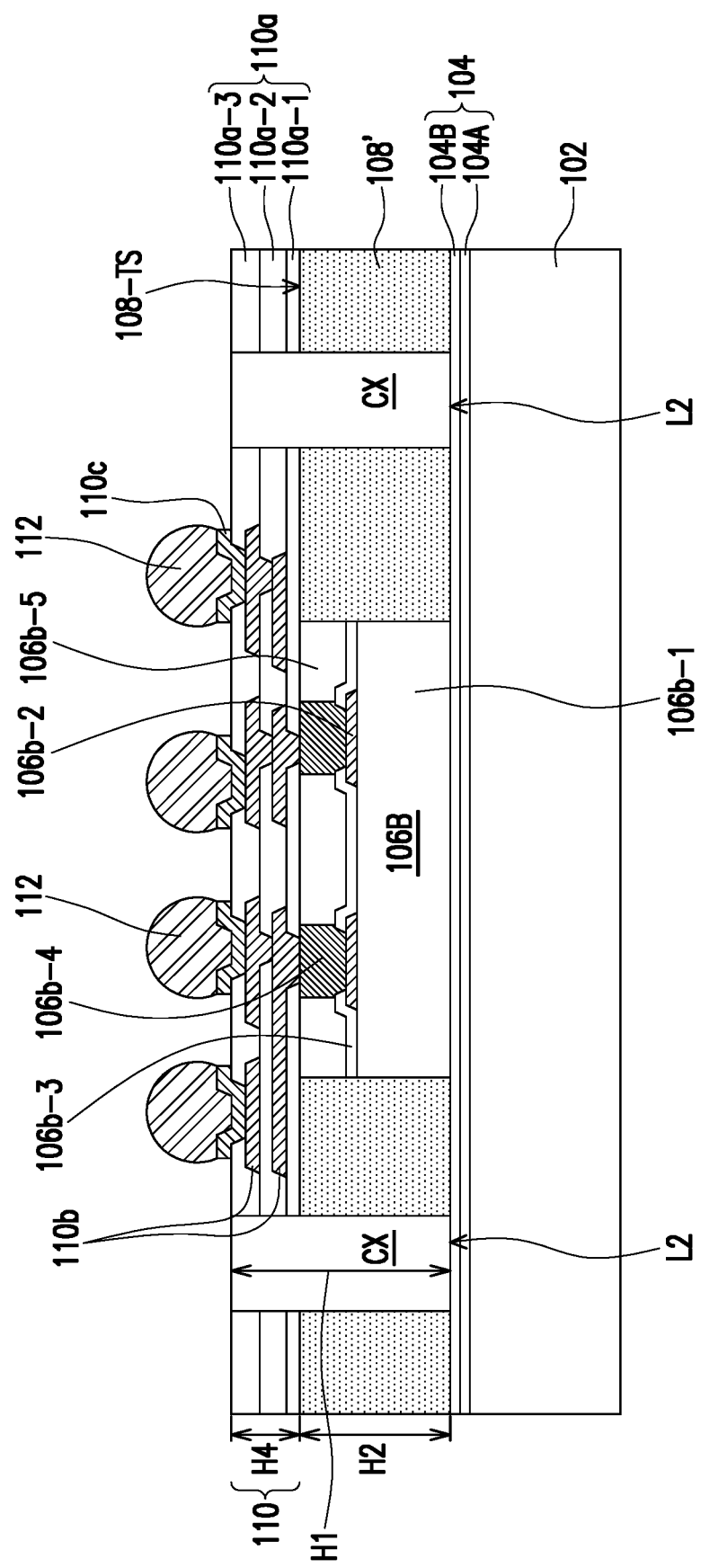

Referring to FIG. 12, after forming the insulating encapsulant 108', a redistribution layer 110 is formed over the insulating encapsulant 108' and formed to surround the plurality of hollow cylinders CX. In the exemplary embodiment, the hollow cylinders CX are surrounded by the insulating encapsulant 108' and the redistribution layer 110. Furthermore, the height H1 of the plurality of hollow cylinders CX is equal to a sum of a height H2 of the insulating encapsulant 108' and a height H4 of the redistribution layer 110. In some embodiments, the formation of the redistribution layer 110 includes sequentially forming one or more dielectric layers 110a, and one or more metallization layers 110b in alternation. For example, the first dielectric layer 110a-1, the second dielectric layer 110a-2 and the third dielectric layer 110a-3 are formed by suitable fabrication techniques such as spin-on coating, chemical vapor deposition (CVD), plasma-enhanced chemical vapor deposition (PECVD) or the like. Furthermore, the metallization layer 110b may be formed by electroplating or deposition and be patterned using photolithography and etching processes. Thereafter, conductive pads 110c and conductive balls 112 may be fabricated in the same way using the methods described in the above embodiments. After forming the redistribution layer 110, the first lid L1 located at one terminal of the hollow cylinders CX may then be removed to reveal the space within the hollow cylinders CX. For instance, the first lids L1 may be removed by mechanical or laser drilling, or other suitable removal techniques.

Figure 13:
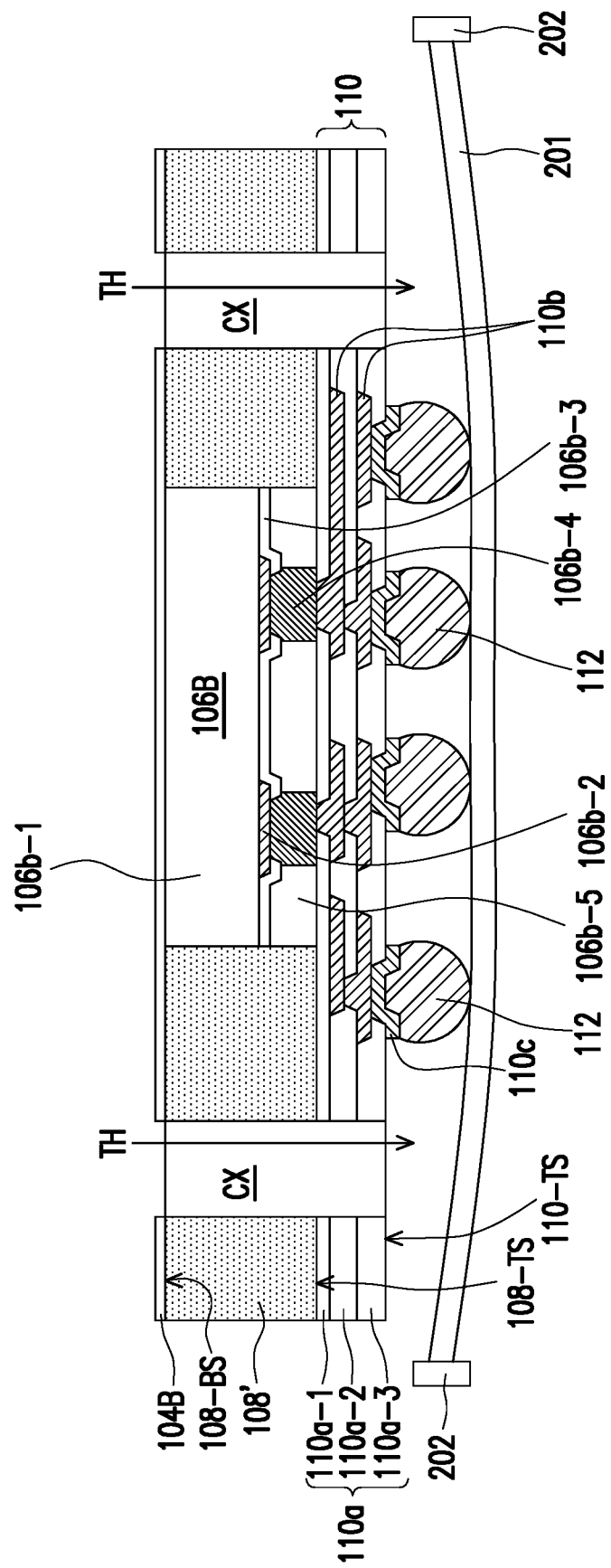

Referring to FIG. 13, after forming the redistribution layer 110 and removing the first lids L1, the structure shown in FIG. 12 may be turned upside down and attached to a tape 201 supported by a frame 202. Subsequently, the carrier 102 is de-bonded so as to separate the dielectric layer 104B and the other elements formed thereon from the carrier 102. In the exemplary embodiment, the de-bonding process includes projecting a light such as a laser light or an UV light on the de-bonding layer 104A (e.g., the LTHC release layer), such that the carrier 102 can be easily removed. In certain embodiments, the de-bonding layer 104A may be further removed or peeled off to reveal the dielectric layer 104B. The remaining dielectric layer 104B may then be patterned to form a plurality of openings that reveal the second lids L2 of the hollow cylinders, wherein the second lids L2 are further removed to complete the formation of the through holes TH. In some embodiments, the through holes TH penetrate through the hollow cylinders CX. In certain embodiments, the through holes TH extends from the bottom surface 108-BS of the insulating encapsulant 108' through the plurality of hollow cylinders CX to a top surface 110-TS of the redistribution layer 110.

Figure 14:
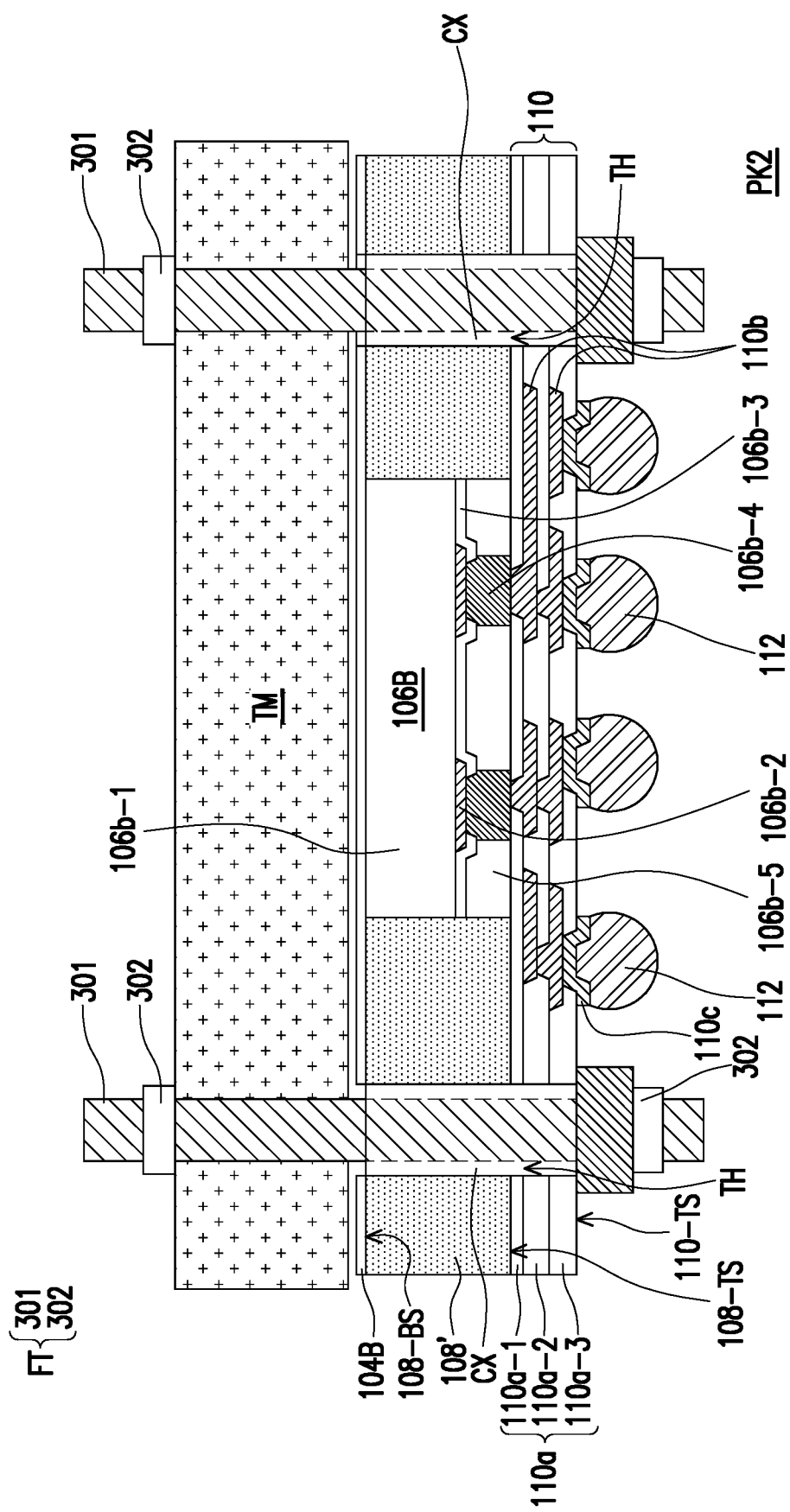

Referring to FIG. 14, after forming the through holes TH, a thermal module TM may be disposed on the bottom surface 108-BS of the insulating encapsulant 108'. In some embodiments, the thermal module TM may be a heat sink, a cold plate, or the like, the disclosure is not limited thereto. In certain embodiments, the thermal module TM may be any type of thermal modules used for improving thermal dissipation. After providing the thermal module TM, a fastener FT is used for mechanically fixing the thermal module TM to the package structure PK2. In some embodiments, the fastener FT includes a bolt 301 that passes through the through holes TH, and nuts 302 located over the thermal module TM and the redistribution layer 110, wherein the nuts 302 are threaded onto the bolt 301. In the exemplary embodiment, bolt 301 and nuts 302 are used as the fastener FT for mechanically fixing the thermal module TM to the package structure PK2, however, the disclosure is not limited thereto. In alternative embodiments, any other type of fasteners that is suitable for mechanically fixing the thermal module TM to the package structure PK2 can be used.

Figure 15:
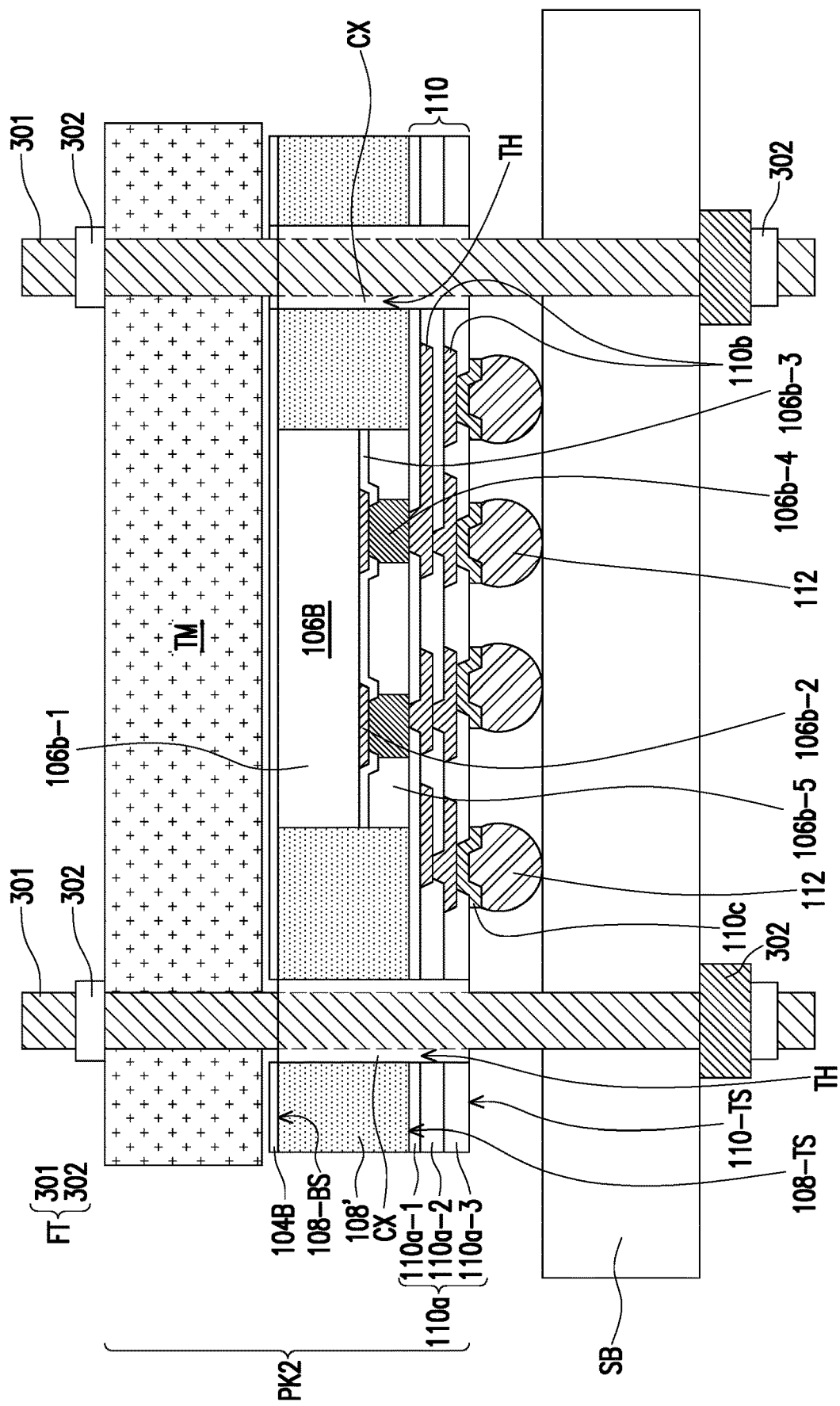
FIG. 15 is a cross-sectional of an electronic assembly according to some other exemplary embodiments of the present disclosure.

FIG. 15 is a cross-sectional of an electronic assembly according to some other exemplary embodiments of the present disclosure. Referring to FIG. 15, in some embodiments, the package structure PK1 obtained in FIG. 14 may be further mounted onto a circuit substrate SB with other packages, passive devices, and connectors (not shown) to form an electronic assembly. In certain embodiments, the package structure PK2 is electrically connected to the circuit substrate SB through the conductive balls 112. After mounting the package structure PK2 onto the circuit substrate SB, the fastener FT is used for mechanically fixing the package structure PK1 to the circuit substrate SB. For example, the fastener FT includes a bolt 301 that passes through the through holes TH, and nuts 302 located over the thermal module TM and the circuit substrate SB, wherein the nuts 302 are threaded onto the bolt 301.

In the above embodiments, a plurality of hollow cylinders is provided prior to forming the insulating encapsulant and the redistribution layer. In some applications that require a though hole in the package structure (e.g. for screw bolt fastening), the mechanical or laser drilling process will cause extra mechanical strain or heat that could induce damage to the package body. The presence of the hollow cylinders will reduce the need of mechanical or laser drilling processes in producing through holes in the package structure. For example, through holes can be simply produced by removing the lids covering the hollow cylinders. As such, damages to the package structure caused by mechanical or laser drilling can be significantly reduced. Furthermore, the process cost can also be significantly reduced.

In some embodiments of the present disclosure, a package structure including at least one semiconductor die, a plurality of hollow cylinders, an insulating encapsulant, a redistribution layer and through holes are provided. The plurality of hollow cylinders is surrounding the at least one semiconductor die. The insulating encapsulant has a top surface and a bottom surface opposite to the top surface, wherein the insulating encapsulant encapsulates the at least one semiconductor die and the plurality of hollow cylinders. The redistribution layer is disposed on the top surface of the insulant encapsulant and over the at least one semiconductor die. The through holes are penetrating through the plurality of hollow cylinders.

In another embodiment of the present disclosure, an electronic assembly including a circuit substrate, a package structure and a fastener is provided. The package structure is disposed on the circuit substrate, wherein the package structure includes at least one semiconductor die, an insulating encapsulant, a plurality of hollow cylinders, a redistribution layer and through holes. The insulating encapsulant has a top surface and a bottom surface opposite to the top surface, wherein the insulating encapsulant encapsulates the at least one semiconductor die. The plurality of hollow cylinders is embedded in the insulating encapsulant. The redistribution layer is disposed on the top surface of the insulant encapsulant and over the at least one semiconductor die. The through holes are extending from the bottom surface of the insulating encapsulant through the plurality of hollow cylinders to a top surface of the redistribution layer. The fastener passes through the through holes of the package structure, and is used for mechanically fixing the package structure to the circuit substrate.

In yet another embodiment of the present disclosure, a method of fabricating a package structure is described. The method includes the following steps. At least one semiconductor die and a plurality of hollow cylinders are placed on a carrier, wherein the plurality of hollow cylinders surround the at least one semiconductor die and have lids covering two opposite terminals of each of the hollow cylinders. An insulating encapsulant is formed to encapsulate the at least one semiconductor die and the plurality of hollow cylinders. A redistribution layer is formed over the insulating encapsulant. The lids covering the terminals of the plurality of hollow cylinders are removed to form through holes extending from a bottom surface of the insulating encapsulant through the plurality of hollow cylinders to a top surface of the redistribution layer. A thermal module is provided on the bottom surface of the insulating encapsulant. A fastener passing though the through holes is provided, wherein the fastener is used for mechanically fixing the thermal module to the package structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
   a semiconductor die;
   a plastic hollow cylinder located aside the semiconductor die;
   an insulating encapsulant encapsulating the semiconductor die and the plastic hollow cylinder;
   a redistribution layer disposed on the insulating encapsulant, wherein the redistribution layer comprises a plurality of dielectric layers and a plurality of metallization layers embedded in the plurality of dielectric layers, and wherein the plurality of metallization layers is electrically connected to the semiconductor die; and a through hole penetrating through the plastic hollow cylinder and penetrating through all the plurality of dielectric layers of the redistribution layer.

2. The structure according to claim 1, wherein a height of the plastic hollow cylinder is equal to a height of the insulating encapsulant.

3. The structure according to claim 1, wherein a height of the plastic hollow cylinder is equal to a sum of an entire height of the insulating encapsulant and an entire height of the redistribution layer.

4. The structure according to claim 1, further comprising:
a thermal module disposed on a bottom surface of the insulating encapsulant; and
a fastener passing though the through hole for mechanically fixing the thermal module to the insulating encapsulant.

5. The structure according to claim 1, wherein the plurality of metallization layers is non-overlapped with the plastic hollow cylinder.

6. The structure according to claim 1, further comprising:
a plurality of conductive balls disposed on and electrically connected to the redistribution layer; and
a circuit substrate, wherein the plurality of conductive balls is connected to the circuit substrate.

7. The structure according to claim 1, further comprising a dielectric layer disposed on a backside surface of the semiconductor die and on the insulating encapsulant, wherein the through hole is further penetrating through the dielectric layer.

8. A structure, comprising:
an insulating encapsulant;
a semiconductor die and a plurality of hollow cylinders embedded in the insulating encapsulant;
a thermal module disposed on the insulating encapsulant, wherein the thermal module comprises a first surface and a second surface opposite to the first surface; and
a fastener passing through the plurality of hollow cylinders and passing through the first surface and the second surface of the thermal module for mechanically fixing the thermal module and the insulating encapsulant together, wherein the fastener is physically separated from the plurality of hollow cylinders.

9. The structure according to claim 8, further comprising a redistribution layer disposed on the insulating encapsulant and electrically connected to the semiconductor die, wherein the fastener further penetrates through the redistribution layer.

10. The structure according to claim 9, wherein the plurality of hollow cylinders extends toward a top surface of the redistribution layer, and surround the fastener penetrating through the redistribution layer.

11. The structure according to claim 9, wherein the redistribution layer has a plurality of metallization layers that is electrically connected to the semiconductor die, and the plurality of hollow cylinders is physically and electrically separated from the plurality of metallization layers.

12. The structure according to claim 9, wherein a height of the plurality of hollow cylinders is equal to a sum of an entire height of the insulating encapsulant and an entire height of the redistribution layer.

13. The structure according to claim 9, wherein the redistribution layer further comprises through hole portions, the fastener penetrates through the through hole portions of the redistribution layer, and an air space exists in between outer sidewalls of the through hole portions and the fastener.

14. The structure according to claim 8, wherein the plurality of hollow cylinders is made of a plastic material.

15. The structure according to claim 8, further comprising a circuit substrate disposed over the insulating encapsulant, wherein the fastener further penetrates through the circuit substrate for mechanically fixing the circuit substrate, the thermal module and the insulating encapsulant together.

16. The structure according to claim 8, further comprising a dielectric layer disposed in between the thermal module and the semiconductor die, wherein the dielectric layer is physically contacting a backside surface of the semiconductor die, and the fastener is further passing through an opening of the dielectric layer.

* * * * *